(12) United States Patent
Zang et al.

(10) Patent No.: US 10,290,654 B2
(45) Date of Patent: May 14, 2019

(54) CIRCUIT STRUCTURES WITH VERTICALLY SPACED TRANSISTORS AND FABRICATION METHODS

(71) Applicant: GLOBALFOUNDRIES Inc., Grand Cayman (KY)

(72) Inventors: Hui Zang, Guilderland, NY (US); Manfred Eller, Beacon, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 20 days.

(21) Appl. No.: 15/160,623

(22) Filed: May 20, 2016

(65) Prior Publication Data

US 2017/0338247 A1 Nov. 23, 2017

(51) Int. Cl.
*H01L 27/12* (2006.01)
*H01L 27/092* (2006.01)
(Continued)

(52) U.S. Cl.
CPC .. *H01L 27/1207* (2013.01); *H01L 21/823821* (2013.01); *H01L 21/845* (2013.01); *H01L 27/0924* (2013.01); *H01L 27/1104* (2013.01); *H01L 27/1116* (2013.01); *H01L 27/1211* (2013.01); *H01L 29/4966* (2013.01); *H01L 21/823412* (2013.01); *H01L 21/823481* (2013.01); *H01L 21/823807* (2013.01); (Continued)

(58) Field of Classification Search
CPC ............ H01L 27/1207; H01L 29/4966; H01L 27/1211; H01L 27/1116; H01L 21/823821; H01L 27/0924; H01L 21/845; H01L 21/823842; H01L 27/1104; H01L 21/823412; H01L 21/823481; H01L 21/823807
See application file for complete search history.

(56) References Cited

U.S. PATENT DOCUMENTS 9,093,550 B1 7/2015 Zhao
9,484,263 B1 11/2016 Lin
(Continued)

OTHER PUBLICATIONS

S. Monfrey, et.al. "Localized SOI technology: an innovative Low Cost self-aligned process for Ultra Thin Si-film on thin BOX integration for Low Power applications", IEDM, p. 693, 2007.
(Continued)

*Primary Examiner* — Ermias T Woldegeorgis
(74) *Attorney, Agent, or Firm* — Thompson Hine LLP; Francois Pagette

(57) ABSTRACT

Circuit structures, such as inverters and static random access memories, and fabrication methods thereof are presented. The circuit structures include, for instance: a first transistor, the first transistor having a first channel region disposed above an isolation region; and a second transistor, the second transistor having a second channel region, the second channel region being laterally adjacent to the first channel region of the first transistor and vertically spaced apart therefrom by the isolation region thereof. In one embodiment, the first channel region and the isolation region of the first transistor are disposed above a substrate, and the substrate includes the second channel region of the second transistor.

8 Claims, 5 Drawing Sheets

(51) Int. Cl.
  *H01L 29/49* (2006.01)
  *H01L 21/8238* (2006.01)
  *H01L 21/84* (2006.01)
  *H01L 27/11* (2006.01)
  *H01L 21/8234* (2006.01)

(52) U.S. Cl.
  CPC .............. *H01L 21/823842* (2013.01); *H01L 21/823878* (2013.01)

(56) References Cited

U.S. PATENT DOCUMENTS

| | | | |
|---|---|---|---|
| 2005/0082531 A1 | 4/2005 | Rim | |
| 2006/0084212 A1 | 4/2006 | Anderson | |
| 2006/0170066 A1* | 8/2006 | Mathew | H01L 27/11 257/401 |
| 2007/0108528 A1 | 5/2007 | Anderson | |
| 2008/0227241 A1 | 9/2008 | Nakabayashi | |
| 2008/0308848 A1 | 12/2008 | Inaba | |
| 2009/0072276 A1 | 3/2009 | Inaba | |
| 2009/0159972 A1 | 6/2009 | Jakschik | |
| 2009/0218632 A1* | 9/2009 | Cheng | H01L 21/823807 257/369 |
| 2011/0175152 A1* | 7/2011 | Booth, Jr. | H01L 21/845 257/306 |
| 2012/0104509 A1 | 5/2012 | Matsumoto | |
| 2012/0181591 A1 | 7/2012 | Chen | |
| 2013/0087855 A1 | 4/2013 | Makiyama | |
| 2013/0175618 A1 | 7/2013 | Cheng | |
| 2013/0299918 A1 | 11/2013 | Kim | |
| 2014/0332861 A1 | 11/2014 | Cheng | |
| 2015/0214340 A1 | 7/2015 | Maeda | |
| 2015/0228647 A1 | 8/2015 | Chang | |
| 2015/0325572 A1 | 11/2015 | Cheng et al. | |
| 2015/0357331 A1 | 12/2015 | Cheng | |
| 2016/0005852 A1 | 1/2016 | Kim | |
| 2016/0111320 A1 | 4/2016 | Shen | |
| 2016/0133703 A1 | 5/2016 | Chang | |
| 2016/0190271 A1 | 6/2016 | You | |
| 2016/0225789 A1 | 8/2016 | Doris | |
| 2016/0284607 A1 | 9/2016 | Cai | |
| 2017/0005165 A1 | 1/2017 | Chen | |

OTHER PUBLICATIONS

Q. Liu, et.al. "Ultra-Thin-Body and BOX (UTBB) Fully Depleted (FD) Device Integration for 22nm Node and Beyond", VLSI Technology, p. 62, 2010.

U.S. Appl. No. 15/160,591, filed May 20, 2016, titled FINFET Circuit Structures With Vertically Spaced Transistors and Fabrication Methods.

* cited by examiner

CIRCUIT STRUCTURES WITH VERTICALLY SPACED TRANSISTORS AND FABRICATION METHODS

FIELD OF THE INVENTION

The present invention relates to semiconductor devices and integrated circuits, and related fabrication methods, and more particularly to circuit structures, such as static random access memory (SRAM) cells, and methods for fabricating circuit structures.

BACKGROUND OF THE INVENTION

Consumer demand continues for increased density integrated circuits, including reduced size processors and logic circuits, and higher capacity memory devices. In an effort to meet such consumer demand, the semiconductor industry continues to pursue advanced technology nodes, in which transistors and other semiconductor devices may be formed with a reduced minimum dimension. Typically, the reduced minimum dimensions refer to the lateral dimensions along the surface of a semiconductor wafer used in the fabrication of the integrated circuits, because two-dimensional semiconductor devices may be conveniently formed using photolithographic patterning and etching steps on the surface of the wafer.

By way of example, a typical SRAM may include six transistors to store a single bit, with the transistors arranged in a particular configuration called an SRAM cell. In addition, an SRAM cell may also include isolation regions to electrically isolate the various transistors. Further, a high density SRAM chip may be formed by repeatedly patterning and forming the SRAM cell design on a wafer, along with affiliated control circuitry. In such a case, the surface area occupied by a single SRAM cell, along with the critical dimensions of the transistors, will determine a limit on the density of the SRAM chip.

Conventionally, two dimensional SRAM cell designs have been used, and as transistor critical dimensions have reduced in advanced technology nodes, the two dimensional designs have been simply scaled down.

BRIEF SUMMARY

The shortcomings of the prior art are overcome, and additional advantages are provided, through the provision, in one aspect, of a circuit structure. The circuit structure includes: a first transistor, the first transistor having a first channel region disposed above an isolation region; and a second transistor, the second transistor having a second channel region, the second channel region being laterally adjacent to the first channel region of the first transistor and vertically spaced apart therefrom by the isolation region thereof.

In another aspect, an inverter is presented. The inverter includes: a p-type transistor, the p-type transistor having a first channel region disposed above an isolation region, the first channel region and the isolation region being disposed above a substrate; an n-type transistor, the n-type transistor having a second channel region, the second channel region being laterally adjacent to the first channel region of the p-type transistor and vertically spaced apart therefrom by the isolation region thereof, where the substrate includes the second channel region of the n-type transistor and the first and second channel regions being vertically spaced apart facilitates inhibition of a leakage current of the inverter; and a gate structure, the gate structure being disposed over and in contact with the first channel region and the second channel region.

In a further aspect, a method for fabricating a circuit structure is presented. The method includes: providing a first transistor above a substrate, the providing including disposing an isolation region of the first transistor above the substrate and a first channel region thereof above the isolation region; and providing a second transistor, the providing including providing a second channel region of the second transistor within the substrate and laterally adjacent to the first channel region of the first transistor and vertically spaced apart therefrom by the isolation region thereof.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
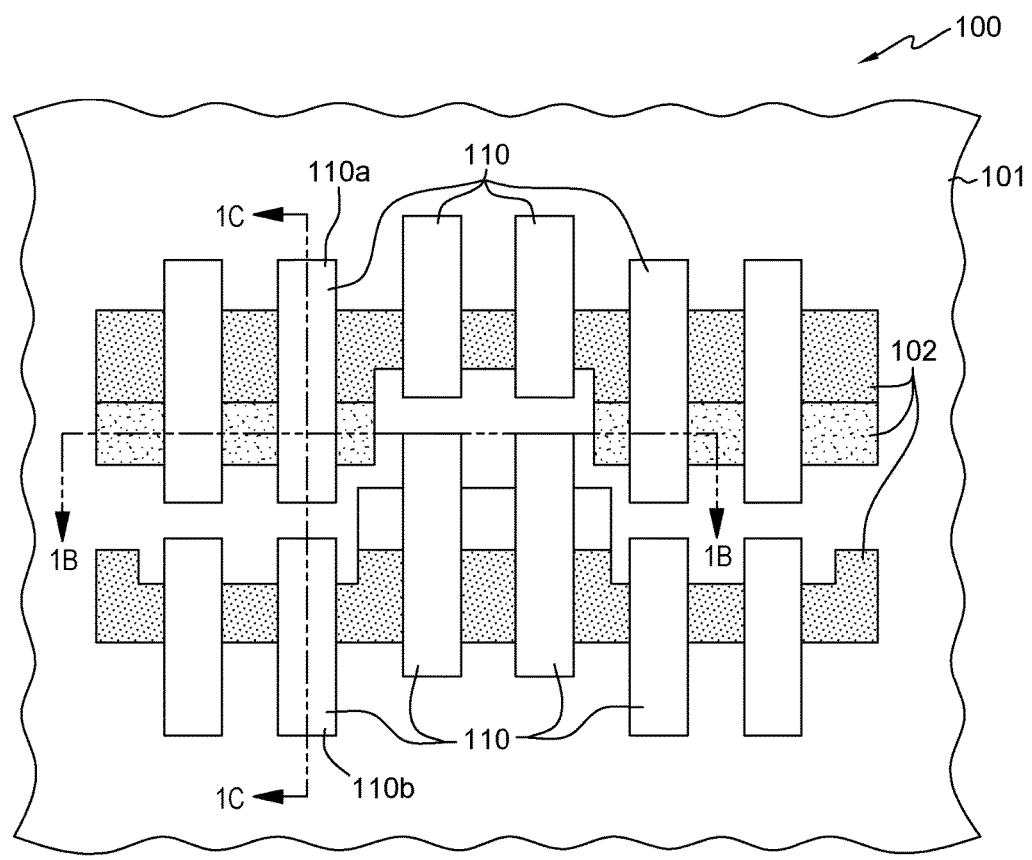
FIG. 1A is a plan view of a circuit structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, three-dimensional circuit structures, such as vertically spaced apart transistors, and related fabrication techniques, for use in, for example, logic or memory circuits. For instance, an SRAM cell includes numerous transistors, such as a six transistor (6T) SRAM cell. In an effort to meet consumer demand for increased density, the transistors may be moved closer together, so that each cell occupies a smaller surface area of a wafer. However, such close spacing could lead to, for example, unacceptable leakage currents, which can increase power consumption and generate unacceptable levels of heat. Therefore, isolation regions are disposed laterally between transistors to prevent such disadvantages. But, as noted above, the lateral surface area of isolation regions adds to the area occupied by each SRAM cell.

Advantageously, the present disclosure overcomes limitations of the prior art by allowing for circuit structures with multiple transistors which may be spaced laterally adjacent. For instance, a complementary metal oxide semiconductor (CMOS) inverter circuit may include two adjacent transistors connected by a common gate structure. In such a case, the active regions of the adjacent transistors may be isolated from one another by being laterally spaced apart, with an isolation material or region disposed in between. In one advantage, the present disclosure allows for the active regions to be laterally adjacent, but vertically spaced apart to achieve isolation. Similar concepts may be applied for any circuit structures that include transistors, such as SRAM cells, logic circuits, memory circuits, analog circuits, etc.

Generally stated, provided herein, in one aspect, is a circuit structure. The circuit structure may include, for example: a first transistor, the first transistor having a first channel region disposed above an isolation region; and a second transistor, the second transistor having a second channel region, the second channel region being laterally adjacent to the first channel region of the first transistor and vertically spaced apart therefrom by the isolation region thereof.

In one embodiment, the first channel region and the isolation region of the first transistor are disposed above a substrate (i.e. SOI), and the substrate includes the second channel region of the second transistor. In another embodiment, the first transistor includes a fin structure on buried oxide (BOX) isolation, and the fin structure includes the first channel region above the BOX isolation region.

In one implementation, the structure further includes a gate structure, the gate structure being disposed over and in contact with the first channel region and the second channel region. In such a case, the gate structure may include a first work function material disposed over the first channel region of the first transistor and a second work function material disposed over the second channel region of the second transistor.

By way of example, the first transistor may be a p-type transistor and the second transistor may be an n-type transistor. In another example, the circuit structure may be or include an inverter, where the first and second channel regions being vertically spaced apart facilitates inhibition of a leakage current of the inverter. In a further example, the circuit structure may be or include a memory, for example a random access memory or a static random access memory, where the first and second channel regions being vertically spaced apart facilitates inhibition of a leakage current of the memory.

In another aspect, an inverter is presented. The inverter may include, for example: a p-type transistor, the p-type transistor having a first channel region disposed above an isolation region, the first channel region and the isolation region being disposed above a substrate; an n-type transistor, the n-type transistor having a second channel region, the second channel region being laterally adjacent to the first channel region of the p-type transistor and vertically spaced apart therefrom by the isolation region thereof, where the substrate includes the second channel region of the n-type transistor and the first and second channel regions being vertically spaced apart facilitates inhibition of a leakage current of the inverter; and a gate structure, the gate structure being disposed over and in electrical contact with the first channel region and the second channel region.

In one embodiment, the p-type transistor includes a fin structure extending from the substrate (e.g. extending above the substrate in three-dimensions), and an upper portion of the fin structure includes the first channel region and a lower portion of the fin structure includes the isolation region. In another embodiment, the gate structure includes a first work function material disposed over the first channel region of the p-type transistor and a second work function material disposed over the second channel region of the n-type transistor.

In another aspect, a method for fabricating a circuit structure is presented. The method may include: providing a first transistor on the Si portion of an SOI substrate, the providing including disposing an isolation region of the first transistor above the substrate (i.e. the BOX) and a first channel region thereof above the isolation region; and providing a second transistor, the providing including providing a second channel region of the second transistor on the substrate (below BOX) and laterally adjacent to the first channel region of the first transistor and vertically spaced apart therefrom by the isolation region, for example, a BOX isolation region thereof.

In one embodiment, providing the first transistor includes providing a fin structure in the Si portion above BOX, where the fin structure includes the first channel region and the fin structure is positioned above the isolation region, for example, BOX region. In another embodiment, the method further includes forming a gate structure including, for example, gate dielectric, work-function layers, and conductive electrode layer, over and in contact with the first channel region of the first transistor and the second channel region of the second transistor. In such a case, the method may also further include planarizing the gate structure by, for example, CMP, to facilitate formation of laterally coplanar metal layers above the circuit structure.

In one implementation, forming the gate structure includes depositing a first work function material over the first channel region of the first transistor and a second work function material over the second channel region of the second transistor. In another implementation, forming the gate structure includes depositing the second work function material over the first channel region of the first transistor and the second channel region of the second transistor; removing the second work function material from over the first channel region of the first transistor; and depositing the first work function material over the first channel region of the first transistor and the second channel region of the second transistor.

In one example, providing the first transistor includes providing the first transistor as a p-type transistor and providing the second transistor includes providing the second transistor as an n-type transistor. In another example, fabricating the circuit structure includes fabricating an inverter, where the first and second channel regions being vertically spaced apart by, for example, BOX, facilitates inhibition of a leakage current of the inverter. In another example, fabricating the circuit structure includes fabricating a static random access memory, where the first and second channel regions being vertically spaced apart facilitates inhibition of a leakage current of the static random access memory.

Reference is made below to the drawings, which are not drawn to scale for ease of understanding, wherein the same reference numbers used throughout different figures designate the same or similar components.

FIG. 1A is a plan view of a structure 100, in accordance with one or more aspects of the present invention. In the embodiment of FIG. 1A, structure 100 represents a portion of an SRAM array which includes numerous repeating 6T SRAM cells.

For instance, in one or more embodiments, structure 100 includes a substrate 101 and various regions 102 which may include active regions of transistors. In the plan view of FIG. 1A, regions 102 are shown to occupy lateral areas of structure 100. As will be described below, the footprints of regions 102 may include three-dimensional circuit structures, and may include the active regions of transistors, including source regions, drain regions, and channel regions. The regions 102 may be made of different materials, for example, the first and third region 102 may be SOI (high) regions and the second or middle region 102 may be a bulk (low) region, as shown in FIG. 1A.

In the embodiment of FIG. 1A, gate structures 110 extend over regions 102 in such a way as to interconnect the various transistors, and the gate structures may include a gate dielectric disposed below a gate conductor.

By way of explanation, a gate structure will overlap a channel region of a transistor, and if a gate structure overlaps two different channel regions, that will constitute an electrical connection between the transistors sharing the common gate. In addition, two adjacent transistors in the same region 102 may share a source/drain, also constituting an electrical connection between the transistors. In such a manner, for example, six transistors may be formed and interconnected to form a 6T SRAM cell.

In one or more embodiments, substrate 101 may be a bulk semiconductor material such as a bulk silicon wafer. In another embodiment, substrate 101 may include silicon (Si), single crystal Si, polycrystalline Si, amorphous Si, Si-on-insulator (SOI), or Si-on-replacement insulator (SRI). In a further embodiment, the substrate can be n-type or p-type doped. In such a case, the substrate may be doped, or various regions may be n-type and p-type doped to form various n-wells and p-wells. In one particular example, the substrate can have a thickness of less than or equal to 0.1 micrometers.

Figure 1B:
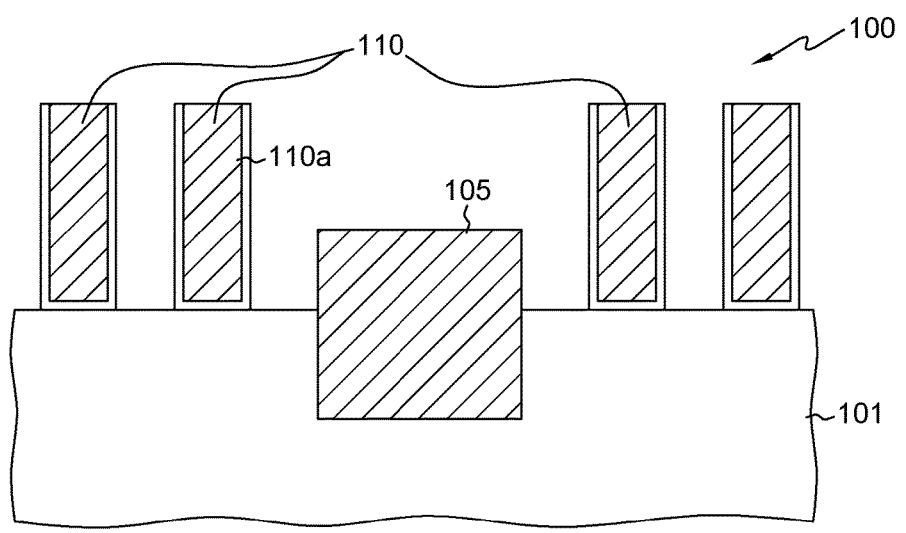
FIG. 1B is a cross-sectional elevational view of the structure of FIG. 1A, taken along line 1B-1B thereof, in accordance with one or more aspects of the present invention.

FIG. 1B is a cross-sectional elevational view of structure 100, taken along line 1B-1B thereof, in accordance with one or more aspects of the present invention. In the embodiment of FIG. 1B, several gate structures 110 are shown, along with an isolation layer 105, which may be a shallow-trench-isolation (STI) or buried oxide (BOX) or any suitable material for electrically isolating transistors.

Figure 1C:
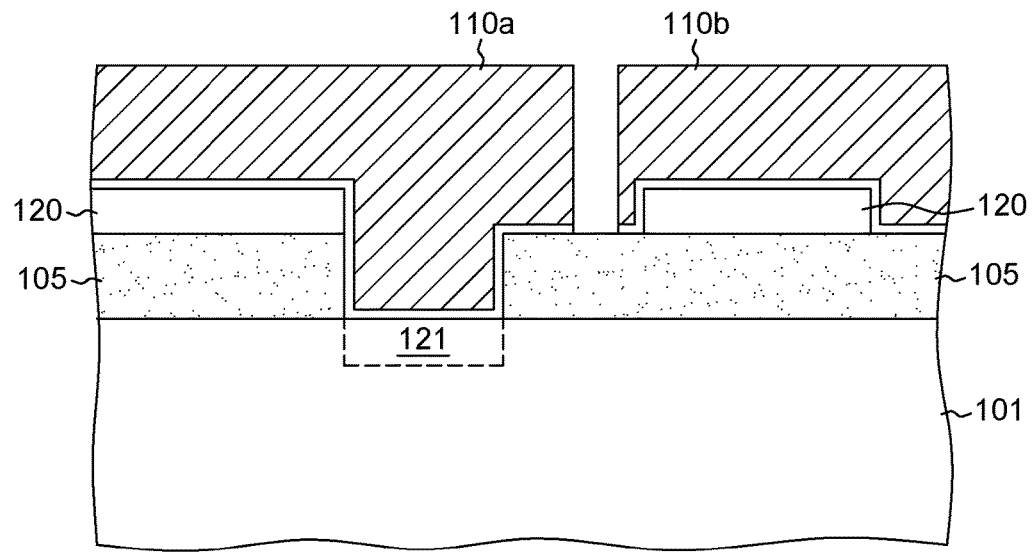
FIG. 1C is a cross-sectional elevational view of the structure of FIG. 1A, taken along line 1C-1C thereof, in accordance with one or more aspects of the present invention.

FIG. 1C is a cross-sectional elevational view of structure 100, taken along line 1C-1C thereof, in accordance with one or more aspects of the present invention. In the embodiment of FIG. 1C, structure 100 depicts three transistors, including two adjacent transistors on the left hand side which are laterally adjacent and vertically spaced apart.

In one or more embodiments, a semiconductor layer 120 with patterns has been disposed above isolation layer 105 (BOX) by using SOI substrate. For example, semiconductor layer 120 may include a channel region of a transistor above BOX. In addition, substrate 101 includes channel regions below BOX, such as channel region 121, of another transistor.

By way of explanation, semiconductor layer 120 on the left side of FIG. 1C is vertically spaced apart from channel region 121 of substrate 101 by isolation layer 105, for example, BOX. Advantageously, making use of a three-dimensional circuit structure allows for isolation between the transistors without using lateral spacing, allowing for a reduction in density of such a circuit structure. In one example, the transistor with a channel region within semiconductor layer 120 on the left hand side of FIG. 1C may be a p-type transistor, and the transistor with channel region 121 of substrate 101 may be an n-type transistor. In another example, the conductivity types of the two transistors may be reversed, i.e., n-type and p-type, respectively. In such an example, the two transistors described may be a complementary metal oxide semiconductor (CMOS) inverter circuit. In one example, the transistor on the left may be an SOI transistor, and the transistor 121 to the right may be a planar transistor on bulk substrate.

One having skill in the art will readily understand that CMOS circuit structures include n-type and p-type transistors interconnected in such a way as to reduce the energy consumption of such circuit structures when compared to circuits having only n-type or only p-type transistors. Indeed, CMOS technologies may be used not only for inverter circuits and SRAM cells, but also for logic, processors, analog, and mixed-signal applications. Advantageously, the techniques described herein will allow for closely spacing such transistors by making use of three-dimension circuit structures, e.g., structures in which one of two adjacent transistors has active region(s), such as a channel region, located at a vertically spaced apart level as compared to the other, allowing for electrical isolation without sacrificing two-dimensional space.

In another embodiment (not shown), a fin-type transistor may be used instead of a planar FET on SOI. In a fin type transistor, Si 120 would be etched to form fin structures. In such a case, one of two adjacent transistors may be formed with an active region near or at the top of a fin (i.e. Si 120), and the other transistor may be formed with an active region at the lower level (i.e. substrate 121) of the substrate. In such a case, even without lateral spacing for isolation, the BOX isolation layer 105 can provide sufficient electrical isolation. For example, the fin-type FET may be formed above BOX and the planar FET may be formed below BOX on the bulk substrate. As shown in FIGS. 1A-1E, the structure may be a SRAM structure with nFET, pull down transistor and pass gate transistor, on SOI, topography high, and pFET, pull-up transistor, on bulk region, topography low.

Figure 1D:
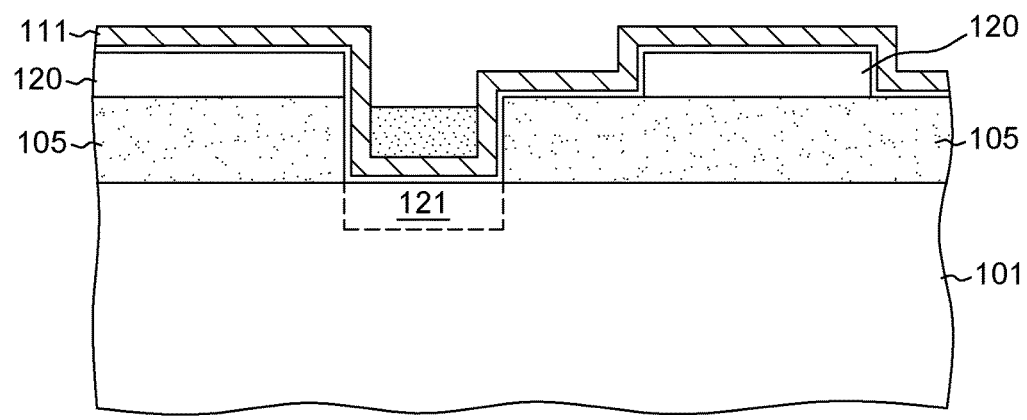
FIG. 1D is a cross-sectional elevational view of a structure found in a circuit structure fabrication process, in accordance with one or more aspects of the present invention.
Figure 1E:
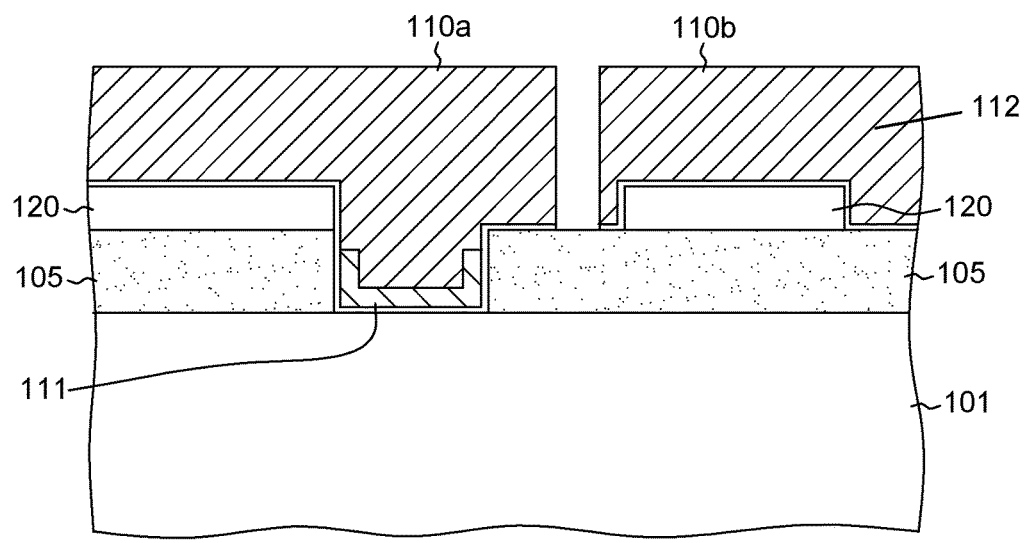
FIG. 1E depicts the structure of FIG. 1D, after depositing a work function material, in accordance with one or more aspects of the present invention.

FIG. 1D-1E depict embodiments of a process for forming a structure 100', in accordance with one or more aspects of the present invention. For example, the process includes providing a first work function material 111 over a first channel region of a first transistor, and a second work function material 112 over a second channel region of a second transistor, as shown in FIG. 1E.

By way of explanation, different conductivity type transistors may require different gate metals in order to achieve desired threshold voltages for the transistors. In one example, p-type transistors may require different metal layers or thickness to be in contact with a gate dielectric from n-type transistors to tune the electrical properties including threshold voltages.

For example, work-function materials more suitable for p-type FET may be or include metals and their nitrides, such as titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN). In another example, work-function materials more suitable for n-type FET may be or include metals and their carbides, such as titanium carbide (TiC), titanium aluminum carbide (TiAlC), titanium aluminide (TiAl) tantalum carbide (TaC), tantalum aluminum carbide (TaAlC), niobium carbide (NbC), vanadium carbide (VC), etc. In another example, work-function materials may also include ruthenium (Ru), platinum (Pt), molybdenum (Mo), cobalt (Co) and alloys and combinations thereof.

In the embodiment of FIGS. 1D-1E, a first work function layer 111 has been disposed over both n-type and p-type transistor regions, and an isolation material 106 has been disposed over p-type regions only.

In one example, after disposing isolation material 106, first work function layer 111 may be selectively etched to remove portions not protected by isolation material 106. Next, as depicted in FIG. 1E, a second work function material 112 may be deposited over structure 100'. In such a manner, the work function material for gate structures above p-type and n-type transistors may be different accordingly.

Figure 2A:
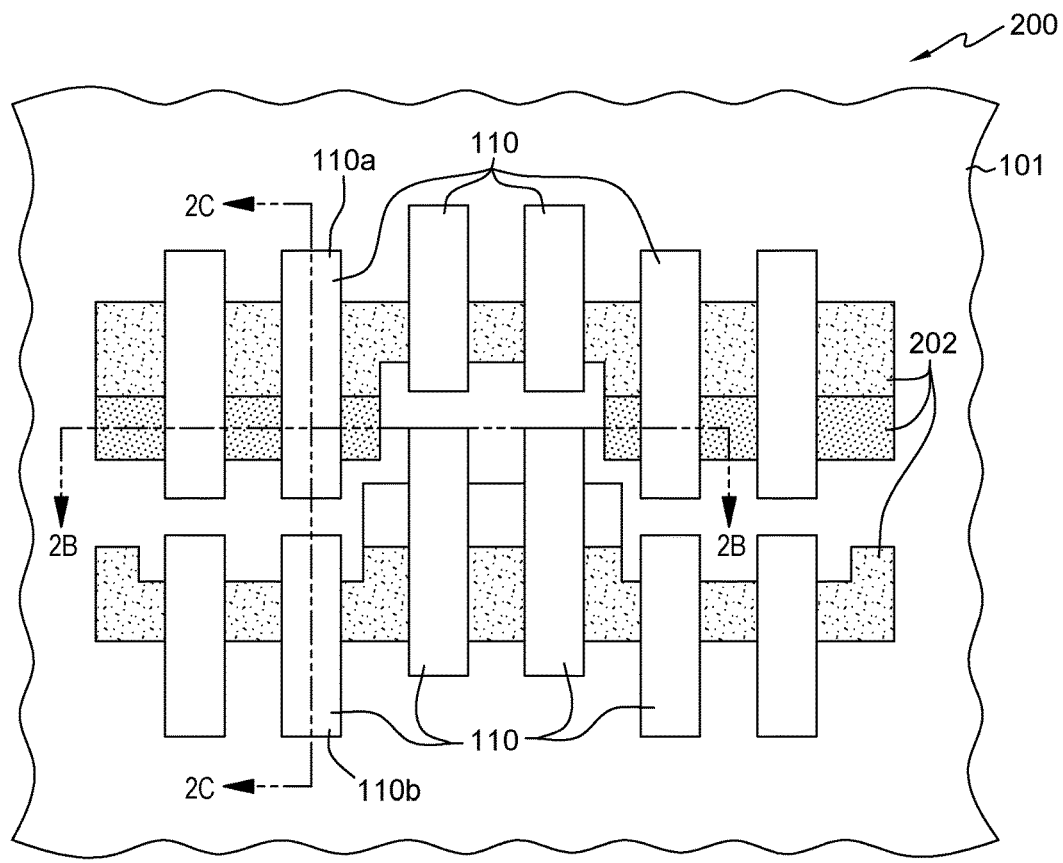
FIG. 2A is a cross sectional elevational view of another circuit structure, in accordance with one or more aspects of the present invention.
Figure 2B:
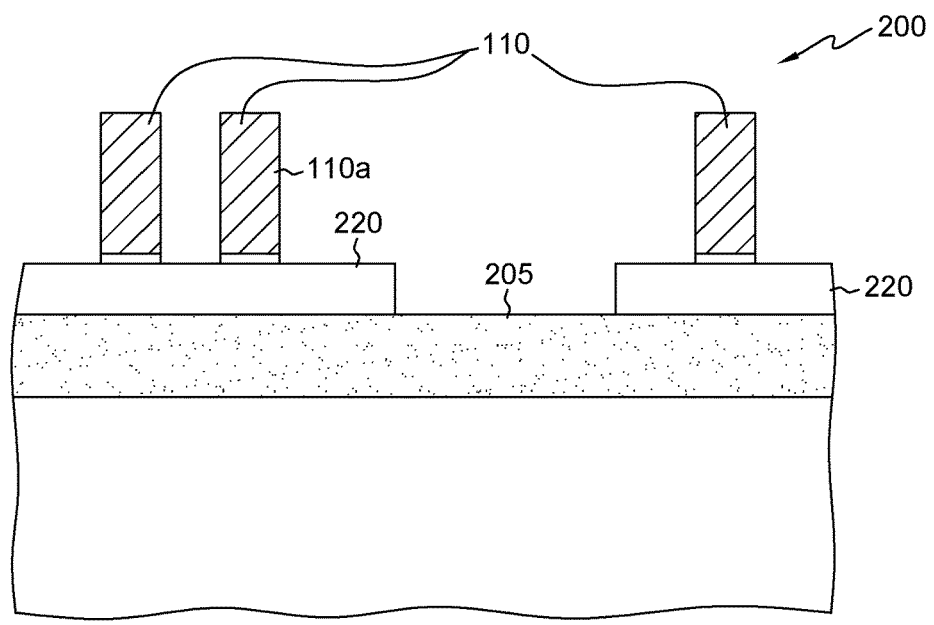
FIG. 2B is a cross-sectional elevational view of the structure of FIG. 2A, taken along line 2B-2B thereof, in accordance with one or more aspects of the present invention.
Figure 2C:
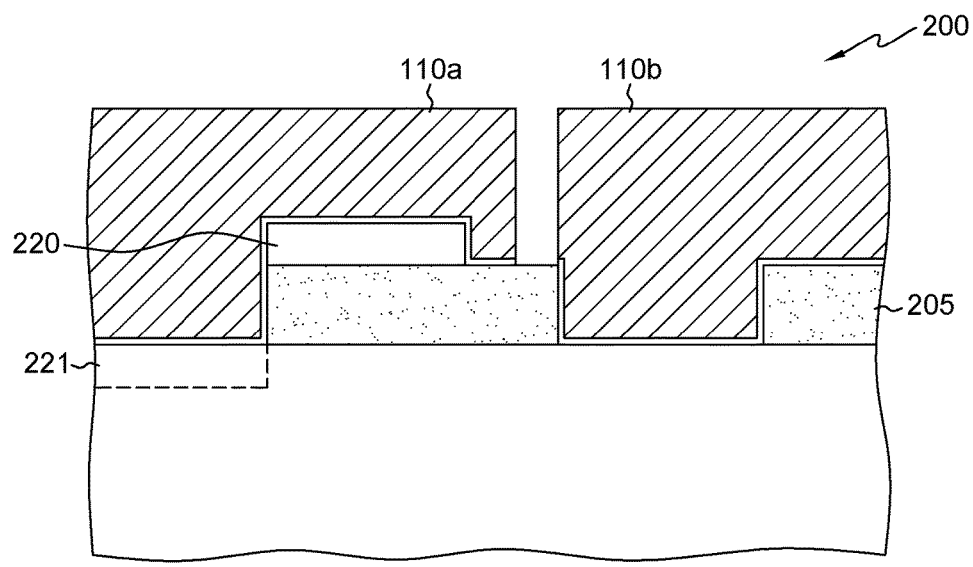
FIG. 2C is a cross-sectional elevational view of the structure of FIG. 2A, taken along line 2C-2C thereof, in accordance with one or more aspects of the present invention.

FIGS. 2A-2C describe another circuit structure 200, in accordance with one or more aspects of the present invention. In the embodiments of FIGS. 2A-2C, structure 200 includes a substrate 101 and various regions 202 which may include active regions of transistors. In the plan view of FIG. 2A, regions 202 are shown to occupy lateral areas of structure 200. As will be described below, the footprints of regions 202 may include three-dimensional circuit structures, and may include the active regions of transistors, including source regions, drain regions, and channel regions. The regions 202 may be made of different materials, for example, the first and third region 202 may be bulk (low) regions and the second or middle region 202 may be a SOI (high) region, as shown in FIG. 2A. The structure 200 may also include an isolation layer 205 and channel region 220. With reference to FIG. 2C, a transistor with a channel region 221 may be disposed laterally adjacent to a transistor with channel region 220, and vertically disposed there below. As shown in FIGS. 2A-2E, the structure 200 may be, for example, a SRAM structure with pFET, pull-up transistor, on SOI, topography high, and nFET, pull down transistor and pass gate transistor on bulk.

Figure 3:
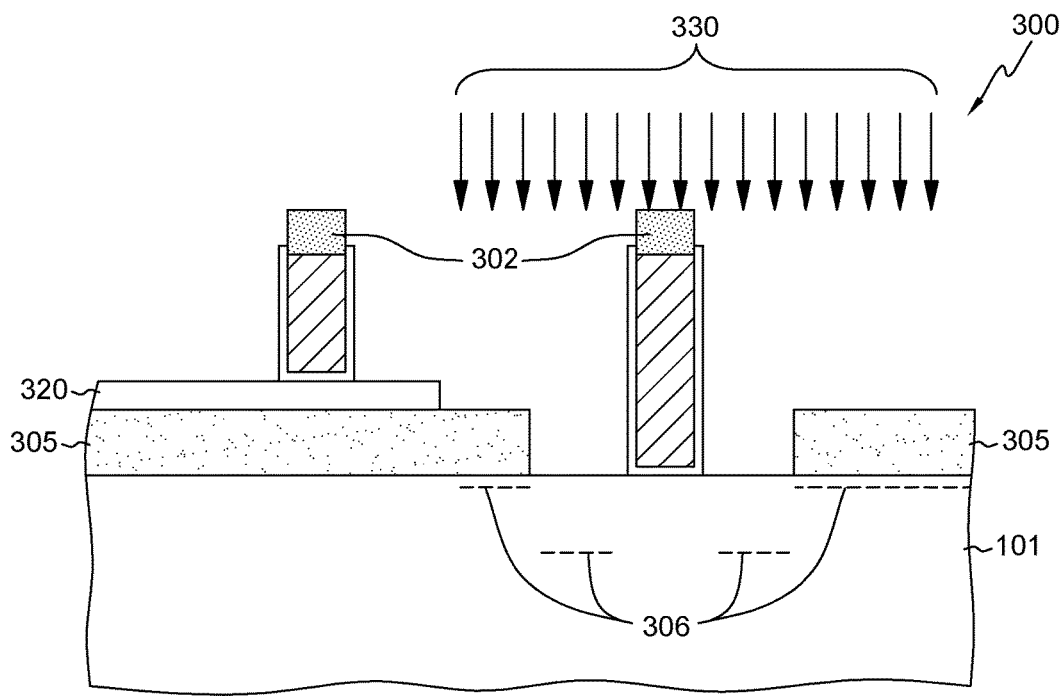
FIG. 3 depicts formation of halo implants, in accordance with one or more aspects of the present invention.

FIG. 3 depicts a structure 300 found in a circuit structure fabrication process, in accordance with one or more aspects of the present invention. In the embodiment of FIG. 3, structure 300 includes isolation layer 305 and semiconductor region 320. In addition, a mask 302 has been disposed above gate structures 110. Further, a halo implants 306 may be formed.

By way of explanation, under certain circumstances, it may be desirable to use halo implants 306 to provide isolation by implanting impurities 330, such as n-type or p-type dopants, within portions of the circuit structure, such as a channel region underlying the gate structure, or the various layers described. Such tuning may be achieved by plasma doping or ion implantation of the circuit structure using various materials.

By way of summary, those skilled in the art will note from the above description that there is a need for enhanced circuit structures, for example, SRAM cells having zero lateral spacing between pull up (PU) and pull down (PD), e.g., using semiconductor on insulator (SOI) technologies. By way of explanation, scaling of SRAM cells is an important factor in each successive technology node, and SOI technology is widely used in low power application, such as computing and communications systems, smartphones, etc., due to low parasitic capacitance, high device performance, and low power. Described herein, at least in part, is a new SRAM cell and integration scheme which is highly compatible with SOI process flow and may significantly reduce the SRAM footprint and increase SRAM density.

Advantageously, a 30% reduction in footprint may be achieved by layouts as described herein. In one embodiment, a p-type field effect transistor (p-FET) PU may be formed on a semiconductor such as silicon above a buried oxide (BOX), and n-type field effect transistors (n-FET) pull up (PU) and pass gate (PG) may be formed on a substrate located vertically below the level of the BOX, e.g., by removing the BOX from n-FET areas (using etching).

In another embodiment, n-FET PD and PG may be formed on a semiconductor above the BOX, and a p-FET PU may be formed on the substrate below the level of the BOX, by removing the BOX from p-FET areas.

In a further example, the PU and PD/PG transistors may be electrically and physically isolated by the BOX itself, eliminating the need for any lateral spacing at all (e.g., using shallow trench isolation), and the BOX isolation may serve to isolate the transistors. For example, a BOX with a thickness of greater than 3 nanometers may by capable of isolating or blocking Vcc of roughly 1 volt or 1.1 volt at a 20 nanometer node.

In one or more embodiments, a self-aligned chamfering process may be used to provide different work function metal gate layers for n-type and p-type transistors. For example, by providing a first work function layer over both regions, protecting the first work function layer in, say, the n-type regions, etching, and forming a second function layer, the first work function layer will contact the n-type regions and the second work function layer will contact the p-type regions. For example, the addition of a second work function metal layer above the first work function metal layer in the n-type regions may not influence electrical properties such as threshold voltages of the transistors because only the first directly contacting layer over the gate dielectric may influence such properties.

Other embodiments include patterning a sacrificial gate structure in a replacement gate process, in which the gate structures are at different vertical levels by first depositing a sacrificial gate (e.g., polysilicon) at a certain thickness (e.g., 100 nm) and then planarizing. Next, hard mask layers may be deposited at certain thickness (e.g., 10 nm). Next, multi-layer patterning layers (e.g., spin on carbon, organic planarizing layer, photoresist) may be deposited, exposure/developing may be performed, followed by hard mask etching, photoresist removal, and polysilicon vertical etch, stopping on silicon. In other examples, transistor halo implants and sources/drains may be formed, followed by replacement metal gate processing.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    fabricating a circuit structure, the fabricating comprising:
        forming a first transistor above a substrate comprising:
            disposing an isolation region of the first transistor above the substrate and a first channel region thereof above the isolation region; and
        forming a second transistor comprising:
            providing a second channel region of the second transistor within the substrate and laterally immediately adjacent to the first channel region of the first transistor and only vertically spaced apart therefrom by the isolation region thereof; and
            forming a gate structure conformally over and in electrical contact with the first channel region of the first transistor and the second channel region of the second transistor, wherein the first transistor and the second transistor share a source and a drain.

2. The method of claim 1, wherein providing the first transistor comprises providing a lower portion of a fin structure, wherein the lower portion comprises the isolation region and an upper portion of the fin structure, wherein the upper portion comprises the first channel region.

3. The method of claim 1, further comprising planarizing the gate structure to facilitate formation of laterally coplanar metal layers above the circuit structure.

4. The method of claim 1, wherein forming the gate structure comprises depositing a first work function material over the first channel region of the first transistor and a second work function material over the second channel region of the second transistor.

5. The method of claim 1, wherein forming the gate structure comprises:
    depositing the second work function material over the first channel region of the first transistor and the second channel region of the second transistor;
    removing the second work function material from over the first channel region of the first transistor; and
    depositing the first work function material over the first channel region of the first transistor and the second channel region of the second transistor.

6. The method of claim 1, wherein providing the first transistor comprises providing the first transistor as a p-type transistor and providing the second transistor comprises providing the second transistor as an n-type transistor.

7. The method of claim 1, wherein fabricating the circuit structure comprises fabricating an inverter, wherein the first and second channel regions being vertically spaced apart facilitates inhibition of a leakage current of the inverter.

8. The of method claim 1, wherein fabricating the circuit structure comprises fabricating a static random access memory, wherein the first and second channel regions being vertically spaced apart facilitates inhibition of a leakage current of the static random access memory.

* * * * *